(12) United States Patent
Chi et al.

(10) Patent No.: US 10,573,600 B2
(45) Date of Patent: Feb. 25, 2020

(54) SEMICONDUCTOR DEVICE AND METHOD OF FORMING ULTRA THIN MULTI-DIE FACE-TO-FACE WLCSP

(71) Applicant: STATS ChipPAC Pte. Ltd., Singapore (SG)

(72) Inventors: HeeJo Chi, Kyoungki-do (KR); NamJu Cho, Gyeonggi-Do (KR); JunWoo Myung, Kyungsangnamdo (KR)

(73) Assignee: STATS ChipPAC Pte. Ltd., Singapore (SG)

(\*) Notice: Subject to any disclaimer, the term of this patent is extended or adjusted under 35 U.S.C. 154(b) by 91 days.

(21) Appl. No.: 15/649,491

(22) Filed: Jul. 13, 2017

(65) Prior Publication Data

US 2017/0309572 A1    Oct. 26, 2017

Related U.S. Application Data

(63) Continuation of application No. 12/786,008, filed on May 24, 2010, now Pat. No. 9,735,113.

(51) Int. Cl.
*H01L 23/538* (2006.01)
*H01L 21/48* (2006.01)
(Continued)

(52) U.S. Cl.
CPC ...... *H01L 23/5389* (2013.01); *H01L 21/4846* (2013.01); *H01L 21/561* (2013.01); *H01L 21/568* (2013.01); *H01L 21/6835* (2013.01); *H01L 23/49827* (2013.01); *H01L 23/552* (2013.01); *H01L 24/11* (2013.01); *H01L 24/19* (2013.01); *H01L 24/20* (2013.01); *H01L 24/24* (2013.01); *H01L 24/25* (2013.01); *H01L 24/82* (2013.01); *H01L 24/95* (2013.01);
(Continued)

(58) Field of Classification Search
CPC ..... H01L 24/96; H01L 24/97; H01L 21/6835; H01L 21/561; H01L 21/568; H01L 23/5389
See application file for complete search history.

(56) References Cited

U.S. PATENT DOCUMENTS 5,250,843 A    10/1993    Eichelberger
5,353,498 A    10/1994    Fillion et al.
(Continued)

*Primary Examiner* — Zandra V Smith
*Assistant Examiner* — Abbigale A Boyle
(74) *Attorney, Agent, or Firm* — Robert D. Atkins; Patent Law Group: Atkins and Associates, P.C.

(57) ABSTRACT

A semiconductor device has a first semiconductor die stacked over a second semiconductor die which is mounted to a temporary carrier. A plurality of bumps is formed over an active surface of the first semiconductor die around a perimeter of the second semiconductor die. An encapsulant is deposited over the first and second semiconductor die and carrier. A plurality of conductive vias is formed through the encapsulant around the first and second semiconductor die. A portion of the encapsulant and a portion of a back surface of the first and second semiconductor die is removed. An interconnect structure is formed over the encapsulant and the back surface of the first or second semiconductor die. The interconnect structure is electrically connected to the conductive vias. The carrier is removed. A heat sink or shielding layer can be formed over the encapsulant and first semiconductor die.

25 Claims, 15 Drawing Sheets

(51) Int. Cl.
  *H01L 21/56* (2006.01)
  *H01L 23/00* (2006.01)
  *H01L 21/683* (2006.01)
  *H01L 23/498* (2006.01)
  *H01L 23/552* (2006.01)
  *H01L 25/065* (2006.01)
  *H05K 1/18* (2006.01)
  *H01L 23/31* (2006.01)
  *H01L 23/367* (2006.01)
  *H05K 3/00* (2006.01)
  *H05K 3/42* (2006.01)

(52) U.S. Cl.
  CPC ............. *H01L 24/96* (2013.01); *H01L 24/97* (2013.01); *H01L 25/0657* (2013.01); *H05K 1/185* (2013.01); *H01L 23/3107* (2013.01); *H01L 23/3128* (2013.01); *H01L 23/3672* (2013.01); *H01L 23/49816* (2013.01); *H01L 24/05* (2013.01); *H01L 24/13* (2013.01); *H01L 24/16* (2013.01); *H01L 24/29* (2013.01); *H01L 24/32* (2013.01); *H01L 24/48* (2013.01); *H01L 24/73* (2013.01); *H01L 24/81* (2013.01); *H01L 2221/68327* (2013.01); *H01L 2221/68359* (2013.01); *H01L 2221/68363* (2013.01); *H01L 2221/68372* (2013.01); *H01L 2221/68381* (2013.01); *H01L 2221/68386* (2013.01); *H01L 2224/0401* (2013.01); *H01L 2224/04042* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/1132* (2013.01); *H01L 2224/1134* (2013.01); *H01L 2224/1145* (2013.01); *H01L 2224/1184* (2013.01); *H01L 2224/11334* (2013.01); *H01L 2224/11462* (2013.01); *H01L 2224/11464* (2013.01); *H01L 2224/11849* (2013.01); *H01L 2224/11901* (2013.01); *H01L 2224/12105* (2013.01); *H01L 2224/131* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16145* (2013.01); *H01L 2224/16225* (2013.01); *H01L 2224/16227* (2013.01); *H01L 2224/16235* (2013.01); *H01L 2224/21* (2013.01); *H01L 2224/2101* (2013.01); *H01L 2224/211* (2013.01); *H01L 2224/215* (2013.01); *H01L 2224/2105* (2013.01); *H01L 2224/22* (2013.01); *H01L 2224/221* (2013.01); *H01L 2224/2405* (2013.01); *H01L 2224/245* (2013.01); *H01L 2224/24011* (2013.01); *H01L 2224/25171* (2013.01); *H01L 2224/2919* (2013.01); *H01L 2224/29144* (2013.01); *H01L 2224/32145* (2013.01); *H01L 2224/32225* (2013.01); *H01L 2224/32245* (2013.01); *H01L 2224/33181* (2013.01); *H01L 2224/45099* (2013.01); *H01L 2224/481* (2013.01); *H01L 2224/4805* (2013.01); *H01L 2224/48091* (2013.01); *H01L 2224/48105* (2013.01); *H01L 2224/48158* (2013.01); *H01L 2224/48175* (2013.01); *H01L 2224/48227* (2013.01); *H01L 2224/48228* (2013.01); *H01L 2224/48245* (2013.01); *H01L 2224/48247* (2013.01); *H01L 2224/73207* (2013.01); *H01L 2224/73209* (2013.01); *H01L 2224/73215* (2013.01); *H01L 2224/73265* (2013.01); *H01L 2224/81005* (2013.01); *H01L 2224/81411* (2013.01); *H01L 2224/81424* (2013.01); *H01L 2224/81439* (2013.01); *H01L 2224/81444* (2013.01); *H01L 2224/81447* (2013.01); *H01L 2224/81455* (2013.01); *H01L 2224/81801* (2013.01); *H01L 2224/82106* (2013.01); *H01L 2224/8385* (2013.01); *H01L 2224/95001* (2013.01); *H01L 2224/97* (2013.01); *H01L 2225/0651* (2013.01); *H01L 2225/06513* (2013.01); *H01L 2225/06517* (2013.01); *H01L 2225/06537* (2013.01); *H01L 2225/06568* (2013.01); *H01L 2225/06589* (2013.01); *H01L 2924/00* (2013.01); *H01L 2924/00012* (2013.01); *H01L 2924/00014* (2013.01); *H01L 2924/014* (2013.01); *H01L 2924/01004* (2013.01); *H01L 2924/01005* (2013.01); *H01L 2924/0105* (2013.01); *H01L 2924/01006* (2013.01); *H01L 2924/01013* (2013.01); *H01L 2924/01014* (2013.01); *H01L 2924/01029* (2013.01); *H01L 2924/01033* (2013.01); *H01L 2924/01047* (2013.01); *H01L 2924/01073* (2013.01); *H01L 2924/01074* (2013.01); *H01L 2924/01078* (2013.01); *H01L 2924/01079* (2013.01); *H01L 2924/01082* (2013.01); *H01L 2924/01322* (2013.01); *H01L 2924/09701* (2013.01); *H01L 2924/12041* (2013.01); *H01L 2924/1306* (2013.01); *H01L 2924/13091* (2013.01); *H01L 2924/14* (2013.01); *H01L 2924/15311* (2013.01); *H01L 2924/181* (2013.01); *H01L 2924/18161* (2013.01); *H01L 2924/18162* (2013.01); *H01L 2924/19041* (2013.01); *H01L 2924/19042* (2013.01); *H01L 2924/19043* (2013.01); *H01L 2924/19104* (2013.01); *H01L 2924/19105* (2013.01); *H01L 2924/3011* (2013.01); *H01L 2924/3025* (2013.01); *H01L 2924/3511* (2013.01); *H01L 2924/3512* (2013.01); *H05K 3/007* (2013.01); *H05K 3/0052* (2013.01); *H05K 3/426* (2013.01)

(56) References Cited

U.S. PATENT DOCUMENTS

| | | |
|---|---|---|
| 5,841,193 A | 11/1998 | Eichelberger |
| 6,075,700 A * | 6/2000 | Houghton ............ H01L 23/3675 165/80.2 |
| 6,204,562 B1 | 3/2001 | Ho et al. |
| 7,187,068 B2 | 3/2007 | Suh et al. |
| 7,335,994 B2 | 2/2008 | Klein et al. |
| 7,341,890 B2 | 3/2008 | Ishimaru et al. |
| 7,501,696 B2 | 3/2009 | Koyama et al. |
| 7,619,901 B2 | 11/2009 | Eichelberger et al. |
| 7,795,721 B2 | 9/2010 | Kurita |
| 2002/0042164 A1* | 4/2002 | Funaya ................ H01L 21/563 438/125 |
| 2004/0036164 A1 | 2/2004 | Koike et al. |
| 2004/0201085 A1* | 10/2004 | Ogawa ................ H01L 21/6835 257/678 |
| 2005/0242422 A1 | 11/2005 | Klein et al. |
| 2006/0208356 A1 | 9/2006 | Yamano et al. |
| 2007/0108580 A1 | 5/2007 | Goller |
| 2008/0246126 A1 | 10/2008 | Bowles et al. |
| 2009/0008762 A1 | 1/2009 | Jung |
| 2009/0127686 A1 | 5/2009 | Yang et al. |
| 2011/0068427 A1 | 3/2011 | Paek et al. |
| 2011/0186977 A1 | 8/2011 | Chi et al. |

* cited by examiner

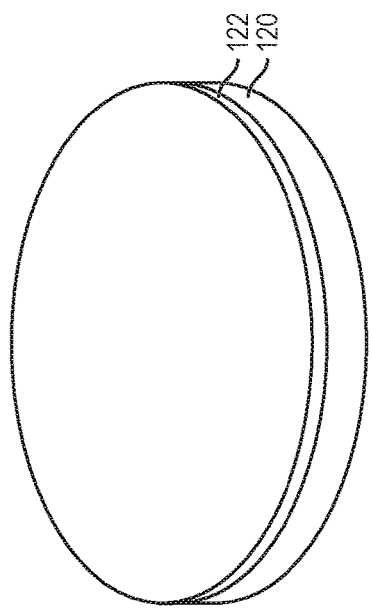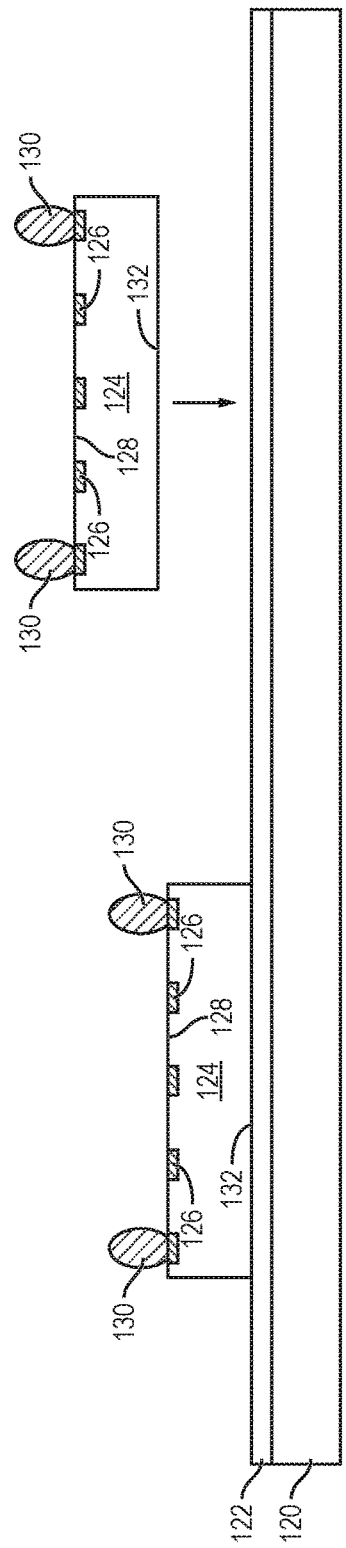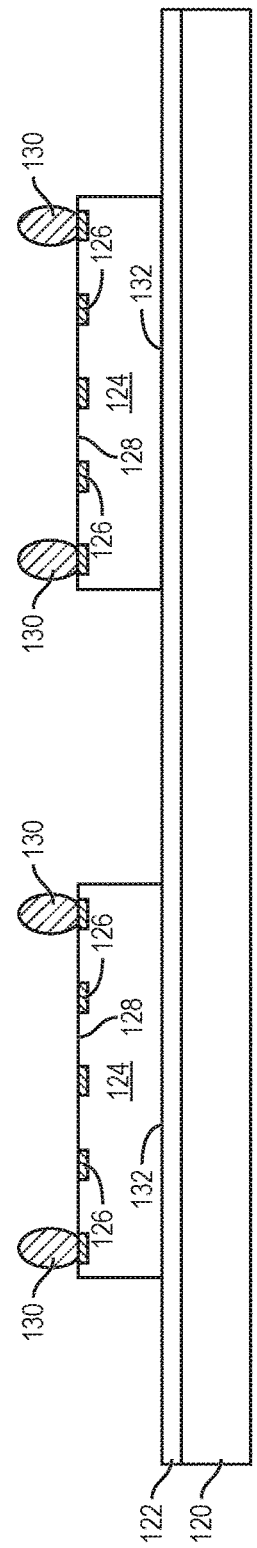

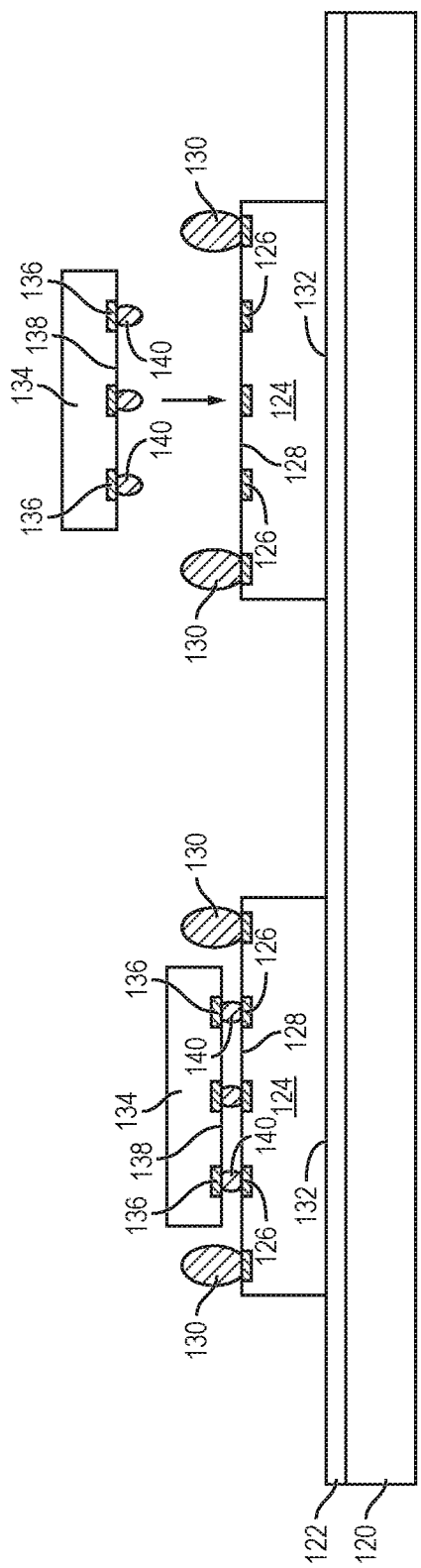
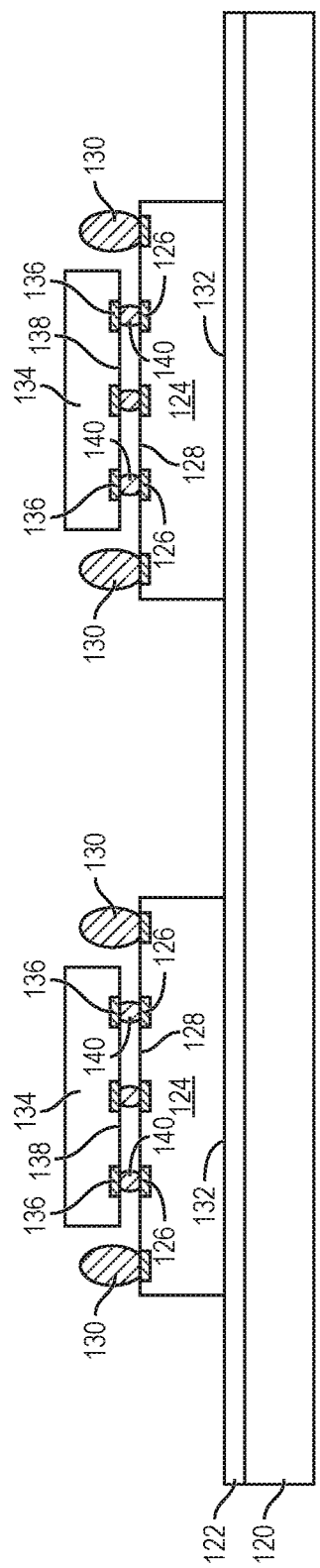
FIG. 3d
FIG. 3e

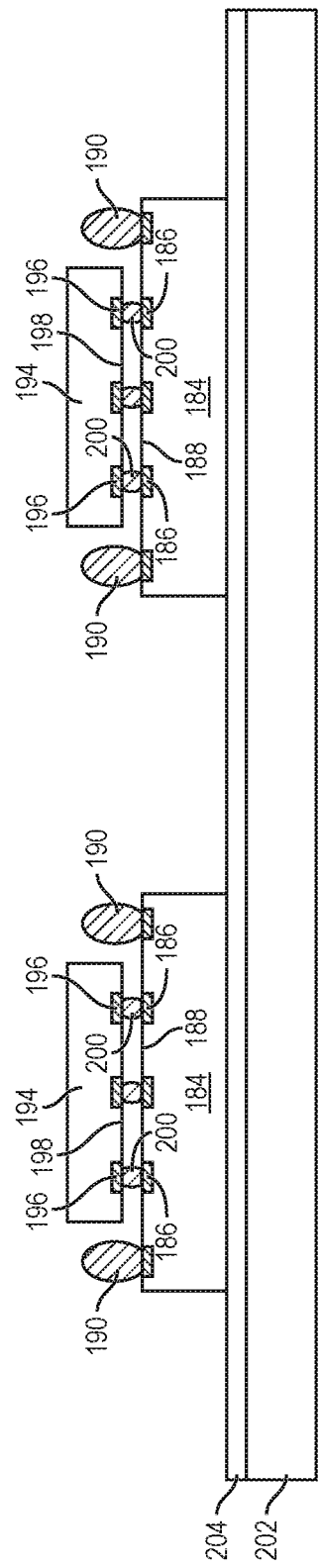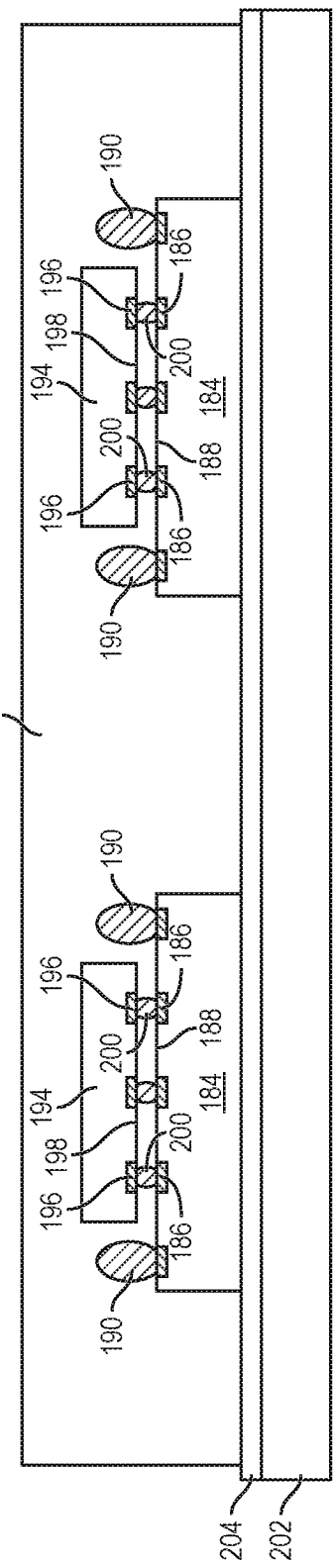

SEMICONDUCTOR DEVICE AND METHOD OF FORMING ULTRA THIN MULTI-DIE FACE-TO-FACE WLCSP

CLAIM TO DOMESTIC PRIORITY

The present application is a continuation of U.S. patent application Ser. No. 12/786,008, now U.S. Pat. No. 9,735,113, filed May 24, 2010, which application is incorporated herein by reference.

FIELD OF THE INVENTION

The present invention relates in general to semiconductor devices and, more particularly, to a semiconductor device and method of forming an ultra thin multi-die face-to-face WLCSP.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In a fan-out wafer level chip scale package (FO-WLCSP) containing stacked semiconductor die, the vertical electrical interconnection can be accomplished with conductive through silicon vias (TSV), through hole vias (THV), or Cu-plated conductive pillars. The vertical interconnect is electrically connected to contact pads on the active surface of the stacked semiconductor die. The semiconductor die are susceptible to die chipping and cracking along the active surface of the die, particularly in the case of thin die. As the need for thinner multi-die packages continues to grow, additional techniques are needed for robust interconnect structures between the stacked semiconductor die.

BRIEF DESCRIPTION OF THE DRAWINGS

FIGS. 5a-5c illustrate stacking the semiconductor die prior to mounting to the carrier;

DETAILED DESCRIPTION OF THE DRAWINGS

Figure 1:
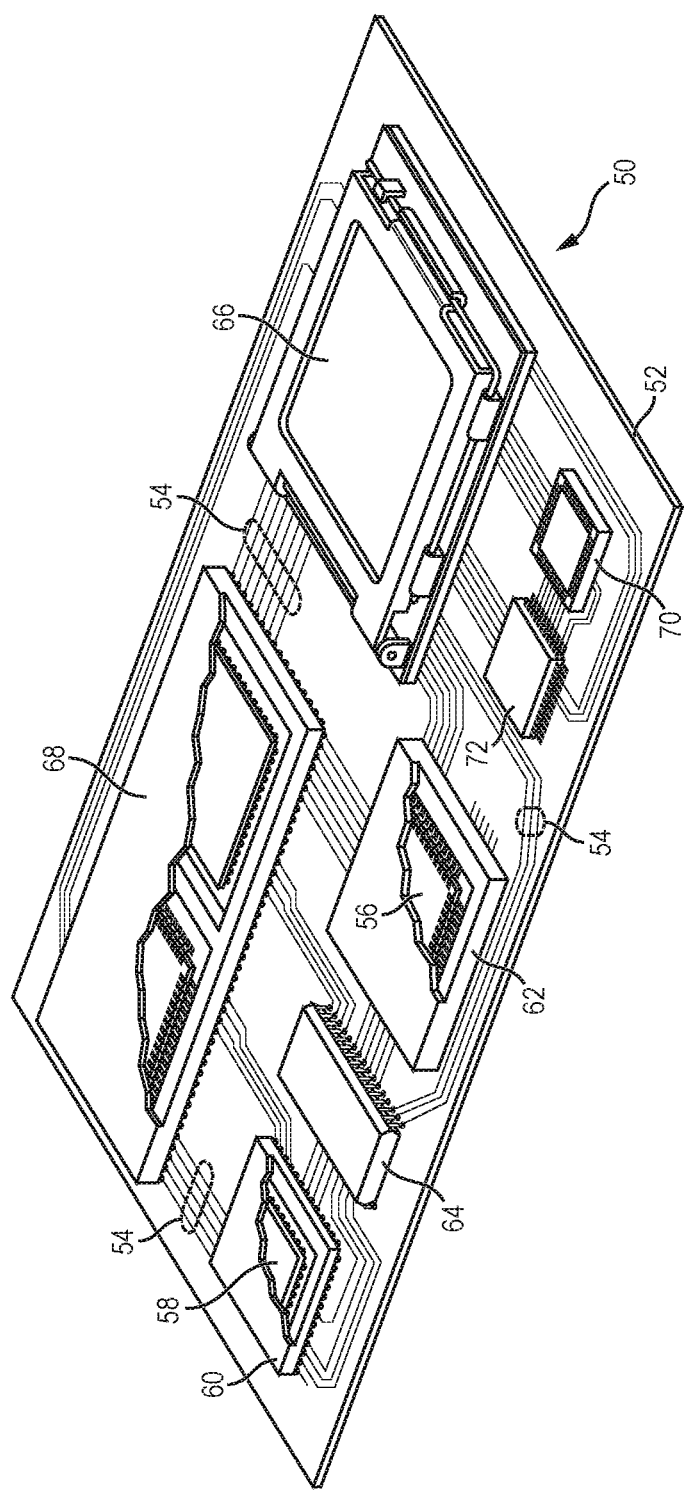
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
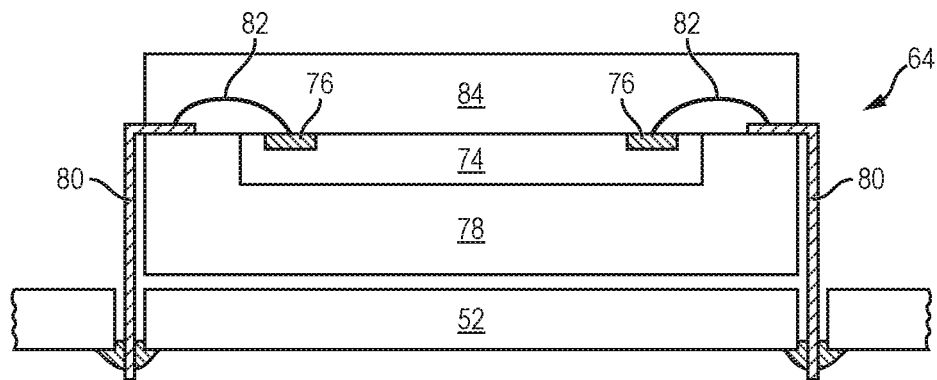
FIGS. 2a-2c illustrate further detail of the representative semiconductor packages mounted to the PCB.
Figure 2B:
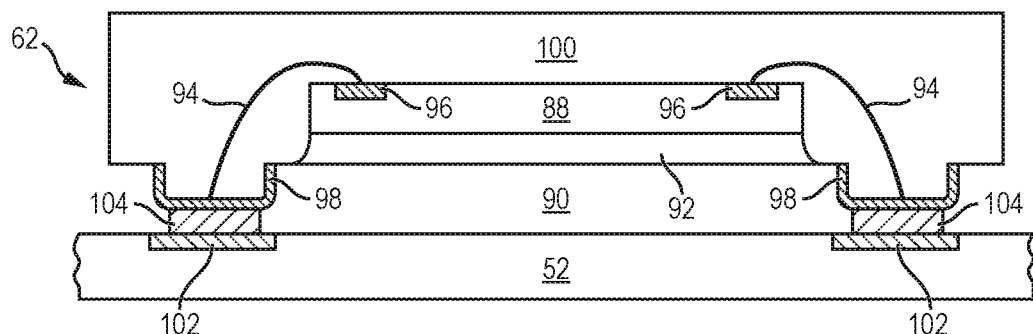
Figure 2C:
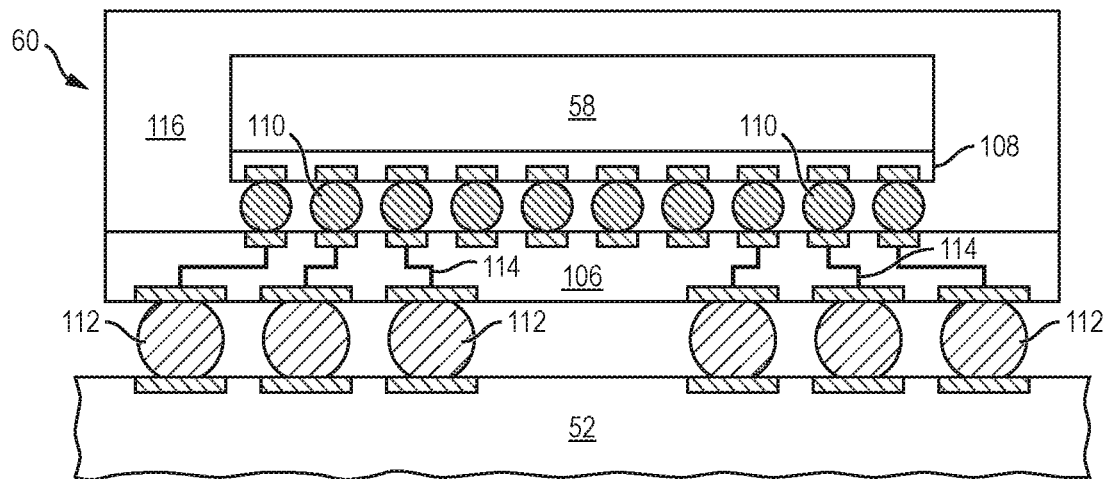

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3F:
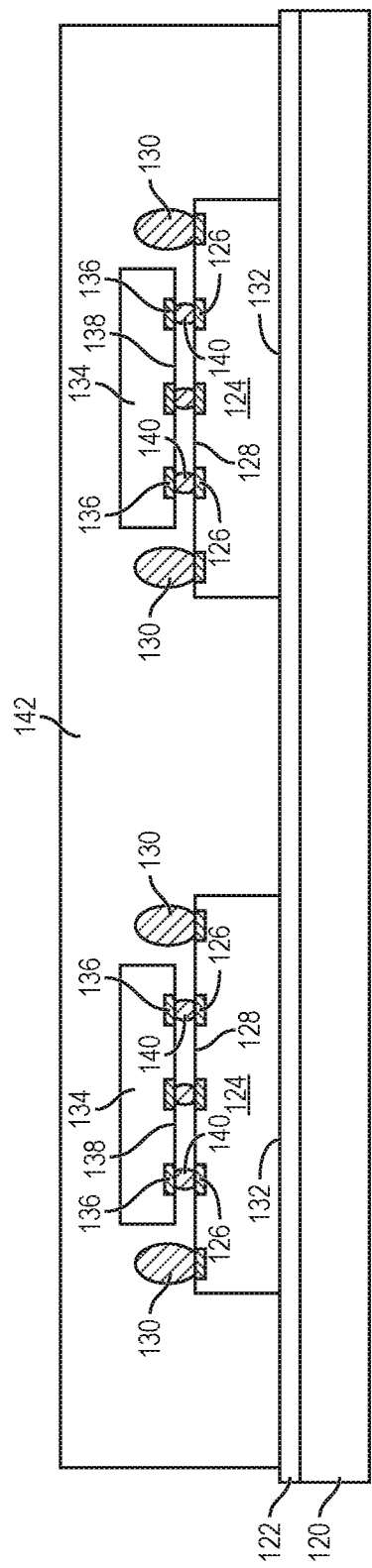
FIGS. 3a-3n illustrate a process of forming an ultra thin multi-die face-to-face WLCSP.
Figure 3G:
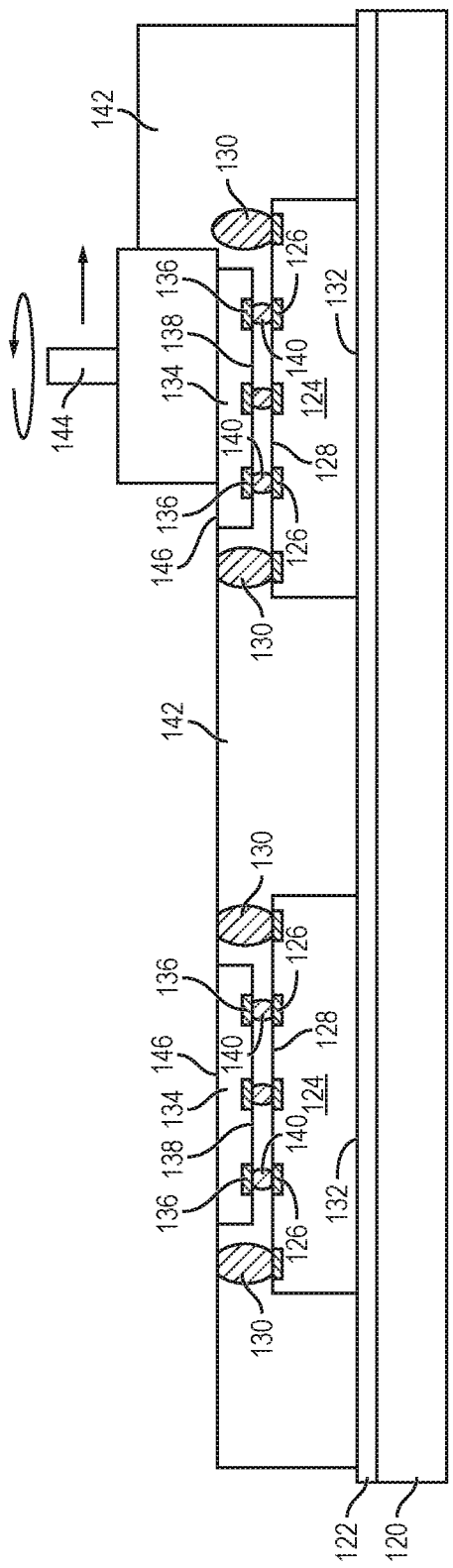
Figure 3H:
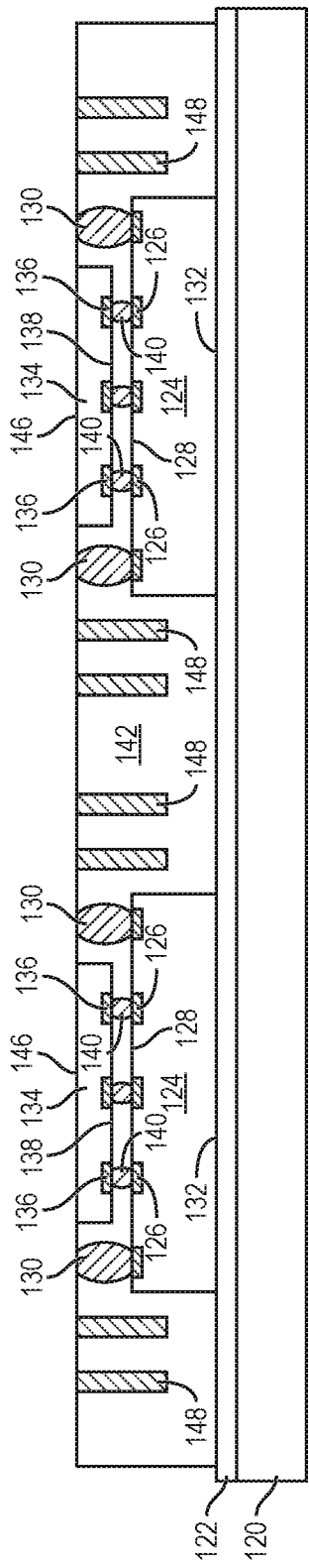
Figure 3I:
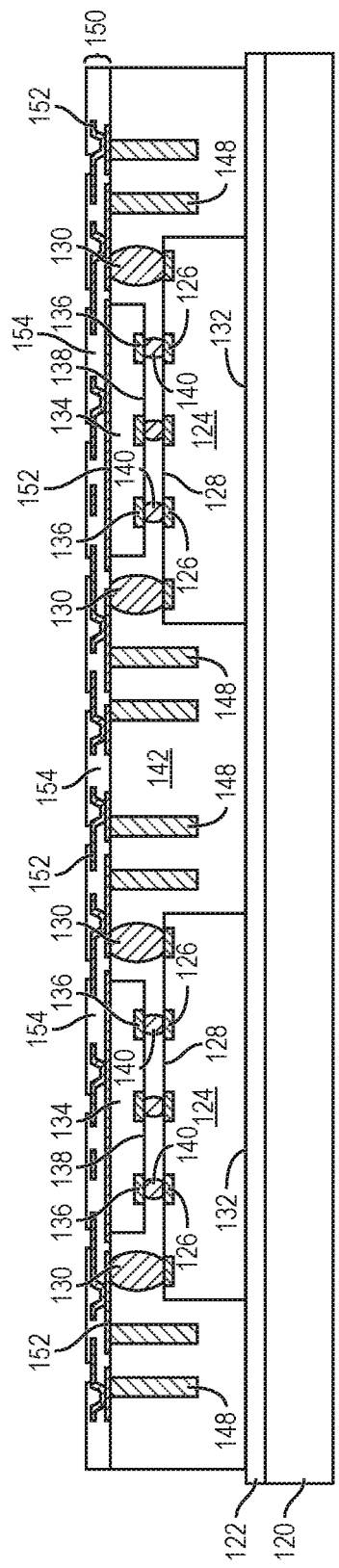
Figure 3J:
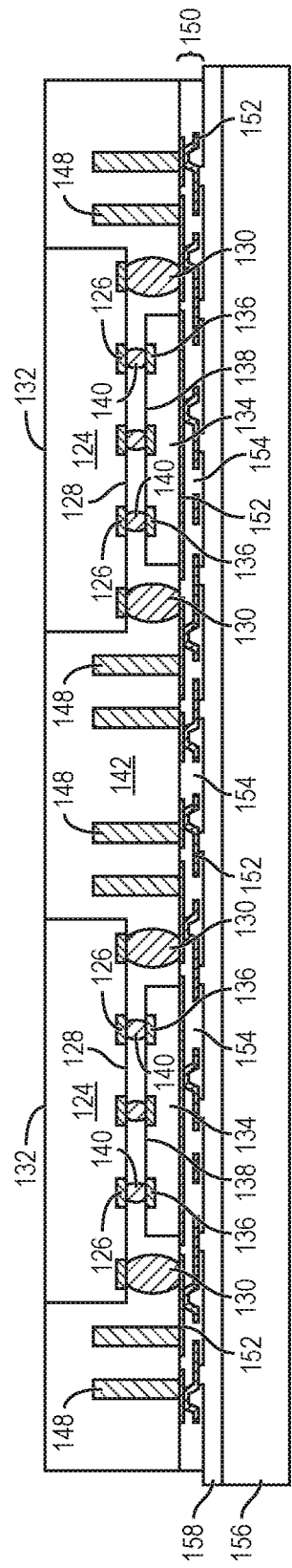
Figure 3K:
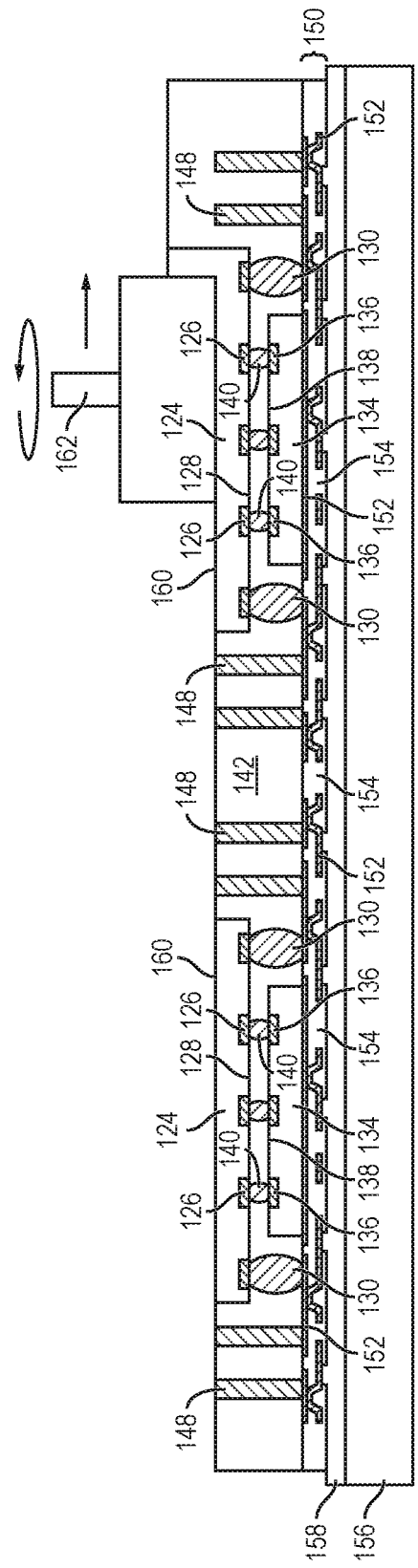
Figures 3L, 3M:
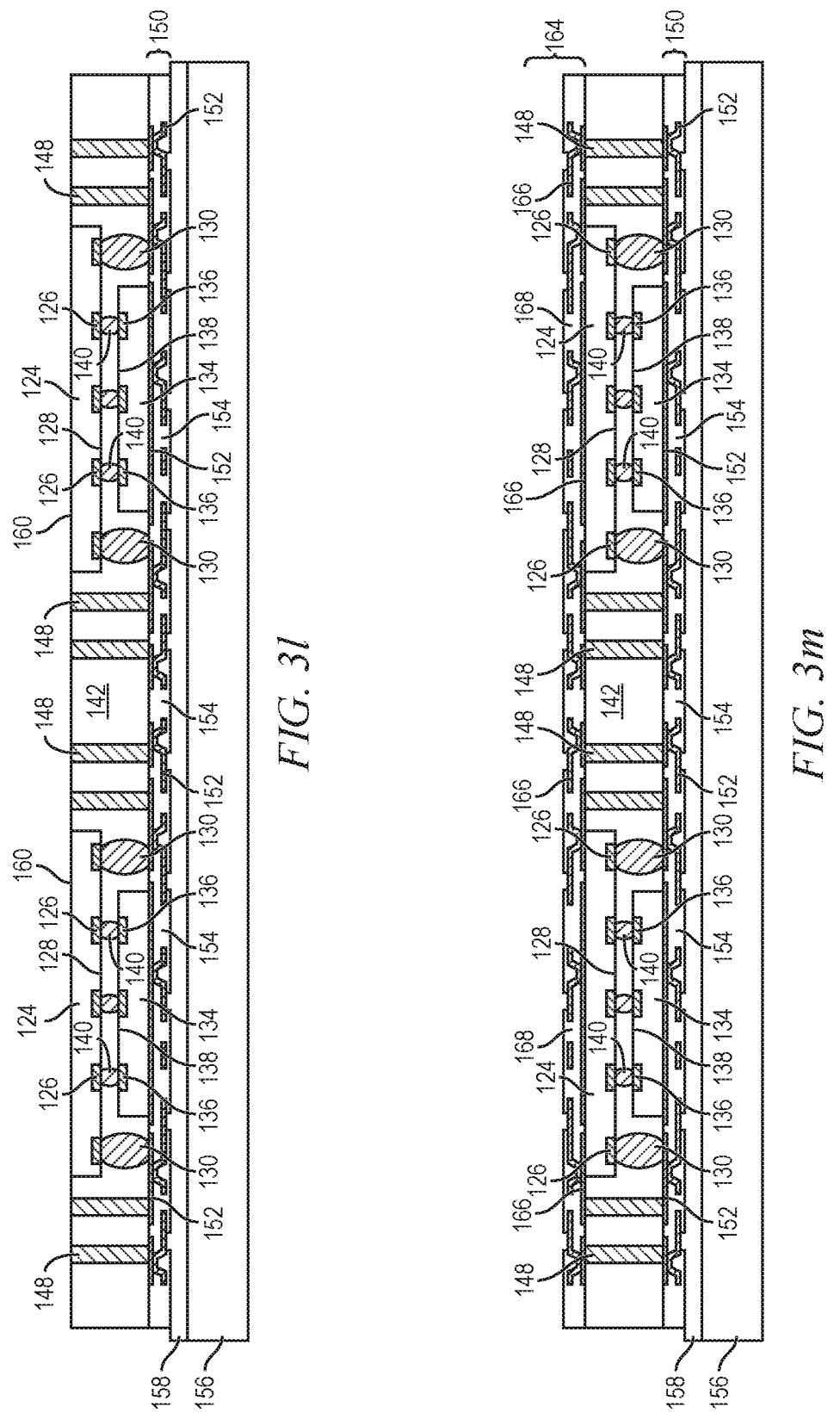
Figure 3N:
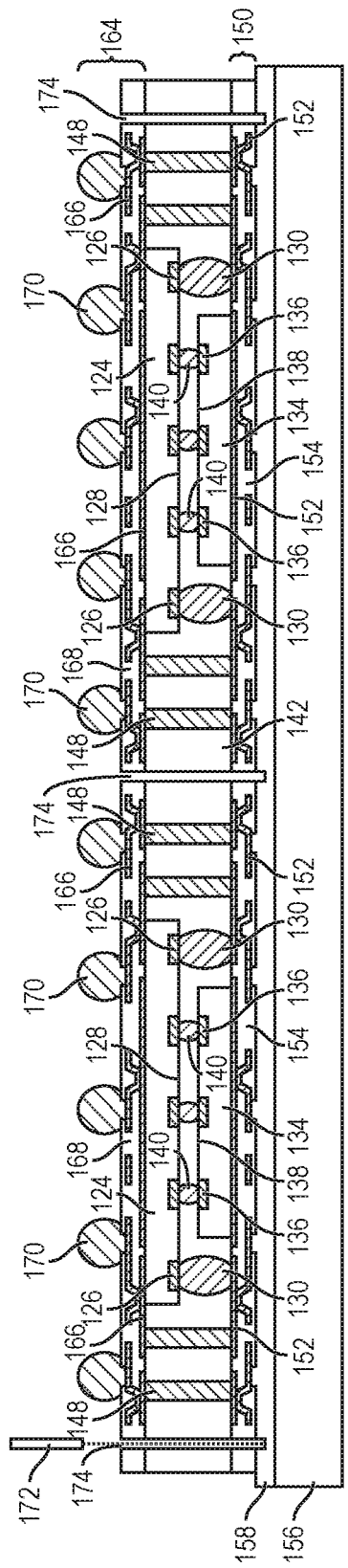

FIGS. 3a-3n illustrate, in relation to FIGS. 1 and 2a-2c, a process of forming an ultra thin multi-die face-to-face WLCSP. In FIG. 3a, a temporary carrier or substrate 120 contains sacrificial base material such as silicon, polymer, polymer composite, metal, ceramic, glass, glass epoxy, beryllium oxide, or other suitable low-cost, rigid material or bulk semiconductor material for structural support. An optional interface layer 122 can be formed over carrier 120 as a temporary adhesive bonding film or etch-stop layer.

FIG. 3b shows a portion of carrier 120 with a plurality of semiconductor die or components 124 mounted to interface layer 122 using a pick and place operation. Contact pads 126 formed over active surface 128 of semiconductor die 124 are oriented upward away from carrier 120. Active surface 128 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 128 to implement analog circuits or digital circuits, such as digital signal processing (DSP), ASIC, memory, or other signal processing circuit. Semiconductor die 124 may also contain IPDs, such as inductors, capacitors, and resistors, for RF signal processing. In one embodiment, semiconductor die 124 is a flipchip type semiconductor die.

An electrically conductive bump material is deposited over those contact pads 126 disposed around a perimeter of semiconductor 124 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 126 using a suitable attachment or bonding process. In one embodiment, the bump material is reflowed by heating the material above its melting point to form spherical balls or bumps 130. In some applications, bumps 130 are reflowed a second time to improve electrical contact to contact pads 126. The bumps can also be compression bonded to contact pads 126. Bumps 130 represent one type of interconnect structure that can be formed over contact pads 126. The interconnect structure can also use stud bump, micro bump, or other electrical interconnect.

FIG. 3c shows all semiconductor die 124 with back surface 132 mounted to interface layer 122 over carrier 120.

In FIG. 3d, a plurality of semiconductor die or components 134 has contact pads 136 formed over active surface 138 which contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 138 to implement analog circuits or digital circuits, such as DSP, ASIC, memory, or other signal processing circuit. Semiconductor die 134 may also contain IPDs, such as inductors, capacitors, and resistors, for RF signal processing. In one embodiment, semiconductor die 134 is a flipchip type semiconductor die. A plurality of micro-bumps 140 is formed over contact pads 136 of semiconductor die 134 by reflow or thermo-compression bonding, similar to the formation of bumps 130.

Semiconductor die 134 have a smaller footprint than semiconductor die 124. Semiconductor die 134 are mounted to contact pads 126 of semiconductor die 124, between bumps 130, with micro-bumps 140. Bumps 130 are formed over those contact pads 126 outside a footprint or mounting site of semiconductor die 134. A discrete passive or active device, such as inductor, capacitor, resistor, or power transistor, can also be mounted to semiconductor die 124. FIG. 3e shows all semiconductor die 134 mounted to semiconductor die 124.

In FIG. 3f, an encapsulant or molding compound 142 is deposited over semiconductor die 124 and 134 and carrier 120 using a paste printing, compressive molding, transfer molding, liquid encapsulant molding, vacuum lamination, spin coating, or other suitable applicator. Encapsulant 142 can be polymer composite material, such as epoxy resin with filler, epoxy acrylate with filler, or polymer with proper filler. Encapsulant 142 is non-conductive and environmentally protects the semiconductor device from external elements and contaminants.

In FIG. 3g, a portion of encapsulant 142 and bulk semiconductor material of semiconductor die 134 are removed by grinder 144 to planarize the encapsulant and back surface 146 of semiconductor die 134 and expose bumps 130. Alternatively, the height of bumps 130 and deposition of encapsulant 142 is controlled to deposit the proper amount to leave back surface 146 of semiconductor die 134 and bumps 130 exposed.

In FIG. 3h, a plurality of vias is formed partially through encapsulant 142 around a periphery of stacked semiconductor die 124 and 134 using mechanical drilling, laser drilling, or deep reactive ion etching (DRIE). The vias are filled with Al, Cu, Sn, Ni, Au, Ag, Ti, tungsten (W), poly-silicon, or other suitable electrically conductive material using electrolytic plating, electroless plating process, or other suitable metal deposition process to form conductive pillars or vias 148. Alternatively, a plurality of stud bumps or solder balls can be formed within the vias. Conductive pillars or vias 148 extend through encapsulant 142 to a depth corresponding to a back surface of semiconductor die 124, following a subsequent grinding operation in FIG. 3k.

In FIG. 3i, a build-up interconnect structure 150 is formed over encapsulant 142, bumps 130, conductive pillars or vias 148, and back surface 146 of semiconductor die 134. The build-up interconnect structure 150 includes an electrically conductive layer or redistribution layer (RDL) 152 formed using a patterning and metal deposition process such as sputtering, electrolytic plating, and electroless plating. Conductive layer 152 can be one or more layers of Al, Cu, Sn, Ni, Au, Ag, or other suitable electrically conductive material. One portion of conductive layer 152 is electrically connected to bumps 130. Another portion of conductive layer 152 is electrically connected to conductive pillars or vias 148. Other portions of conductive layer 152 can be electrically common or electrically isolated depending on the design and function of semiconductor die 124 and 134.

The build-up interconnect structure 150 further includes an insulating or passivation layer 154 formed between conductive layers 152 for electrical isolation. The insulating layer 154 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 154 is formed using PVD, CVD, printing, spin coating, spray coating, sintering or thermal oxidation. The combination of conductive layer 152 and insulating layer 154 can be used to form integrated passive devices, e.g. metal-insulator-metal (MIM) capacitor or wound inductor. A portion of insulating layer 154 is removed to expose conductive layer 152 for bump formation or additional package interconnect.

In FIG. 3j, a temporary carrier or substrate 156 contains sacrificial base material such as silicon, polymer, polymer composite, metal, ceramic, glass, glass epoxy, beryllium oxide, or other suitable low-cost, rigid material or bulk semiconductor material for structural support. An optional interface layer 158 can be formed over carrier 156 as a temporary adhesive bonding film or etch-stop layer. The assembly described in FIGS. 3a-3i is inverted and mounted to interface layer 158 over carrier 156. The carrier 120 and interface layer 122 are removed by chemical etching, mechanical peel-off, CMP, mechanical grinding, thermal bake, laser scanning, or wet stripping.

In FIG. 3k, a portion of encapsulant 142 and bulk semiconductor material of semiconductor die 124 is removed by grinder 162 to planarize the encapsulant and back surface 160 of semiconductor die 124 and expose conductive pillars or vias 148, as shown in FIG. 3l.

In FIG. 3m, a build-up interconnect structure 164 is formed over encapsulant 142, conductive pillars or vias 148, and back surface 160 of semiconductor die 124. The build-up interconnect structure 164 includes an electrically conductive layer or RDL 166 formed using a patterning and metal deposition process such as sputtering, electrolytic plating, and electroless plating. Conductive layer 166 can be one or more layers of Al, Cu, Sn, Ni, Au, Ag, or other suitable electrically conductive material. One portion of conductive layer 166 is electrically connected to conductive pillars or vias 148. Other portions of conductive layer 166 can be electrically common or electrically isolated depending on the design and function of semiconductor die 124 and 134.

The build-up interconnect structure 164 further includes an insulating or passivation layer 168 formed between conductive layers 166 for electrical isolation. The insulating layer 168 contains one or more layers of SiO2, Si3N4, SiON, Ta2O5, Al2O3, or other material having similar insulating and structural properties. The insulating layer 168 is formed using PVD, CVD, printing, spin coating, spray coating, sintering or thermal oxidation. The combination of conductive layer 166 and insulating layer 168 can be used to form integrated passive devices, e.g. MIM capacitor or wound inductor. A portion of insulating layer 168 is removed to expose conductive layer 166 for bump formation or additional package interconnect.

In FIG. 3n, an electrically conductive bump material is deposited over build-up interconnect structure 164 and electrically connected to conductive layer 166 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 166 using a suitable attachment or bonding process. In one embodiment, the bump material is reflowed by heating the material above its melting point to form spherical balls or bumps 170. In some applications, bumps 170 are reflowed a second time to improve electrical contact to conductive layer 166. An under bump metallization (UBM) can be formed under bumps 170. The bumps can also be compression bonded to conductive layer 166. Bumps 170 represent one type of interconnect structure that can be formed over conductive layer 166. The interconnect structure can also use bond wires, stud bump, micro bump, or other electrical interconnect.

A channel 174 is cut through interconnect structures 150 and 164 and encapsulant 142 between one set of stacked semiconductor die 124 and 134 and the adjacent set of stacked semiconductor die 124 and 134 using saw blade or laser cutting tool 172. Channel 174 extends down to interface layer 158. The temporary carrier 156 and interface layer 158 are removed by chemical etching, mechanical peel-off, CMP, mechanical grinding, thermal bake, laser scanning, or wet stripping to singulate the sets of stacked semiconductor die 124 and 134.

Figure 4A:
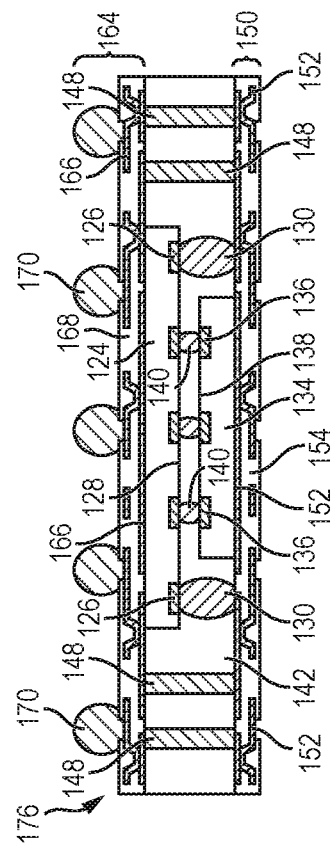
FIGS. 4a-4b illustrate the ultra thin multi-die face-to-face WLCSP with bumps formed over opposing interconnect structures.

FIG. 4a shows 3D multi-die face-to-face FO-WLCSP 176 after singulation. Semiconductor die 124 and 134 are electrically connected through bumps 130 and 140, interconnect structures 150 and 164, and conductive pillars or vias 148. FO-WLCSP 176 is made ultra thin with semiconductor die 124 and 134 mounted face-to-face, i.e., active surface 128 to active surface 138, and electrically interconnected with micro-bumps 140, bumps 130, conductive vias 148, and interconnect structures 150 and 164. Bumps 130 formed over contact pads 126 of semiconductor die 124 around a perimeter of the smaller semiconductor die 134 provide electrical interconnect capability while reducing package height. A portion of the bulk semiconductor material of die 124 and 134 is removed after die attach and encapsulation to reduce the thickness of FO-WLCSP 176 and enhance thermal and electrical performance. By backgrinding after encapsulation, and using carriers on both sides for additional support, FO-WLCSP 176 has a robust structure for handling the thin die with less chipping, cracking, breakage, or warpage.

Figure 4B:
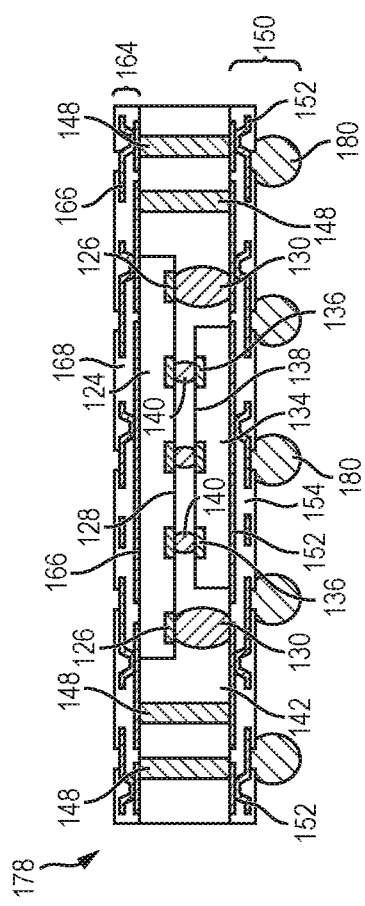

FIG. 4b shows an embodiment, similar to FIG. 4a, for FO-WLCSP 178 with an electrically conductive bump material deposited over build-up interconnect structure 150 and electrically connected to conductive layer 152 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 152 using a suitable attachment or bonding process. In one embodiment, the bump material is reflowed by heating the material above its melting point to form spherical balls or bumps 180. In some applications, bumps 180 are reflowed a second time to improve electrical contact to conductive layer 152. A UBM can be formed under bumps 180. The bumps can also be compression bonded to conductive layer 152. Bumps 180 represent one type of interconnect structure that can be formed over conductive layer 152. The interconnect structure can also use bond wires, stud bump, micro bump, or other electrical interconnect.

The 3D multi-die face-to-face FO-WLCSP 178 contains semiconductor die 124 and 134 electrically connected through bumps 130 and 140, interconnect structures 150 and 164, and conductive pillars or vias 148. FO-WLCSP 178 is made ultra thin with semiconductor die 124 and 134 mounted face-to-face, i.e., active surface 128 to active surface 138, and electrically interconnected with micro-bumps 140, bumps 130, conductive vias 148, and interconnect structures 150 and 164. Bumps 130 formed over contact pads 126 of semiconductor die 124 around a perimeter of the smaller semiconductor die 134 provide electrical interconnect capability while reducing package height. A portion of the bulk semiconductor material of die 124 and 134 is removed after die attach and encapsulation to reduce the thickness of FO-WLCSP 178 and enhance thermal and electrical performance. By backgrinding after encapsulation, and using carriers on both sides for additional support, FO-WLCSP 178 has a robust structure for handling the thin die with less chipping, cracking, breakage, or warpage.

Figure 5A:
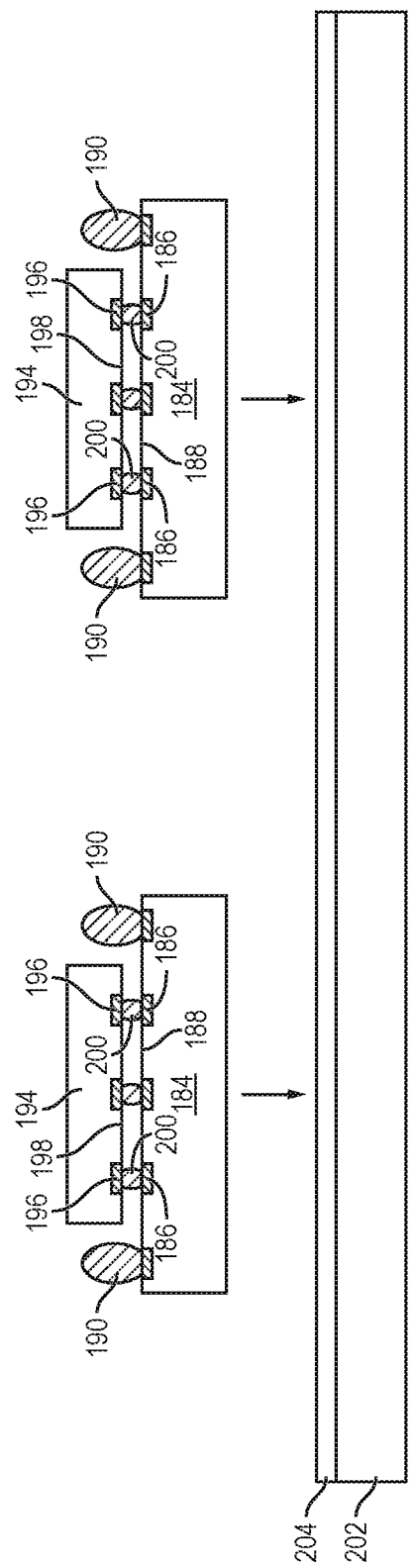

In another embodiment, semiconductor die or components 184 has contact pads 186 formed over active surface 188 which contains analog or digital circuits implemented as active devices, passive devices, conductive layers, and dielectric layers formed within the die and electrically interconnected according to the electrical design and function of the die, as shown in FIG. 5a. For example, the circuit may include one or more transistors, diodes, and other circuit elements formed within active surface 188 to implement analog circuits or digital circuits, such as DSP, ASIC, memory, or other signal processing circuit. Semiconductor die 184 may also contain IPDs, such as inductors, capacitors, and resistors, for RF signal processing. In one embodiment, semiconductor die 184 is a flipchip type semiconductor die.

An electrically conductive bump material is deposited over those contact pads 186 disposed around a perimeter of semiconductor 184 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 186 using a suitable attachment or bonding process. In one embodiment, the bump material is reflowed by heating the material above its melting point to form spherical balls or bumps 190. In some applications, bumps 190 are reflowed a second time to improve electrical contact to contact pads 186. The bumps can also be compression bonded to contact pads 186. Bumps 190 represent one type of interconnect structure that can be formed over contact pads 186. The interconnect structure can also use stud bump, micro bump, or other electrical interconnect.

A plurality of semiconductor die or components 194 has contact pads 196 formed over active surface 198 which contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 198 to implement analog circuits or digital circuits, such as DSP, ASIC, memory, or other signal processing circuit. Semiconductor die 194 may also contain IPDs, such as inductors, capacitors, and resistors, for RF signal processing. In one embodiment, semiconductor die 194 is a flipchip type semiconductor die. A plurality of micro-bumps 200 is formed over contact pads 196 of semiconductor die 194 by reflow or thermo-compression bonding, similar to the formation of bumps 190.

Semiconductor die 194 have a smaller footprint than semiconductor die 184. Semiconductor die 194 are mounted to contact pads 186 of semiconductor die 184, between bumps 190, with micro-bumps 200. Bumps 190 are formed over those contact pads 186 outside a footprint or mounting site of semiconductor die 194. A discrete passive or active device, such as inductor, capacitor, resistor, or power transistor, can also be mounted to semiconductor die 184.

A temporary carrier or substrate 202 contains sacrificial base material such as silicon, polymer, polymer composite, metal, ceramic, glass, glass epoxy, beryllium oxide, or other suitable low-cost, rigid material or bulk semiconductor material for structural support. An optional interface layer 204 can be formed over carrier 202 as a temporary adhesive bonding film or etch-stop layer.

In FIG. 5b, the stacked semiconductor die 184 and 194 are mounted to interface layer 204 over carrier 202.

In FIG. 5c, an encapsulant or molding compound 206 is deposited over semiconductor die 184 and 194 and carrier 202 using a paste printing, compressive molding, transfer molding, liquid encapsulant molding, vacuum lamination, spin coating, or other suitable applicator. Encapsulant 206 can be polymer composite material, such as epoxy resin with filler, epoxy acrylate with filler, or polymer with proper filler. Encapsulant 206 is non-conductive and environmentally protects the semiconductor device from external elements and contaminants.

The backgrinding of the semiconductor die and formation of conductive pillars or vias and interconnect structures continue as described in FIG. 3g-3n. The final FO-WLCSP is similar to FIGS. 4a and 4b.

Figure 6:
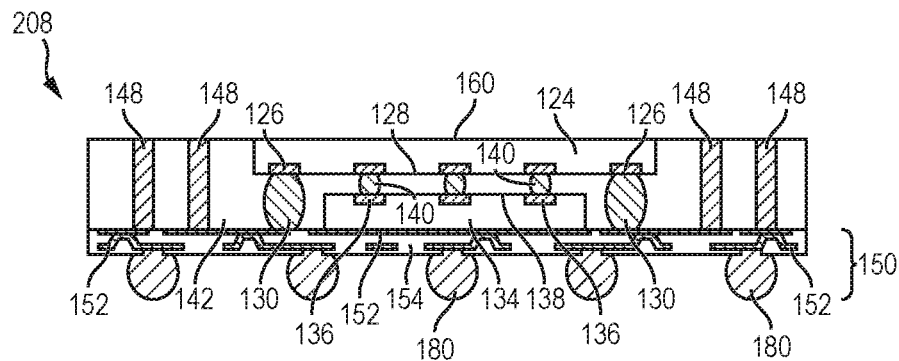
FIG. 6 illustrates the WLCSP without the topside interconnect structure.

FIG. 6 shows an embodiment for 3D FO-WLCSP 208, similar to FIG. 4b, without forming the interconnect structure 164 over semiconductor die 124, encapsulant 142, and conductive pillars or vias 148. Back surface 160 of semiconductor die 124 is exposed from encapsulant 142. Conductive pillars or vias 148 are the top electrical interconnect for FO-WLCSP 208.

Figure 7:
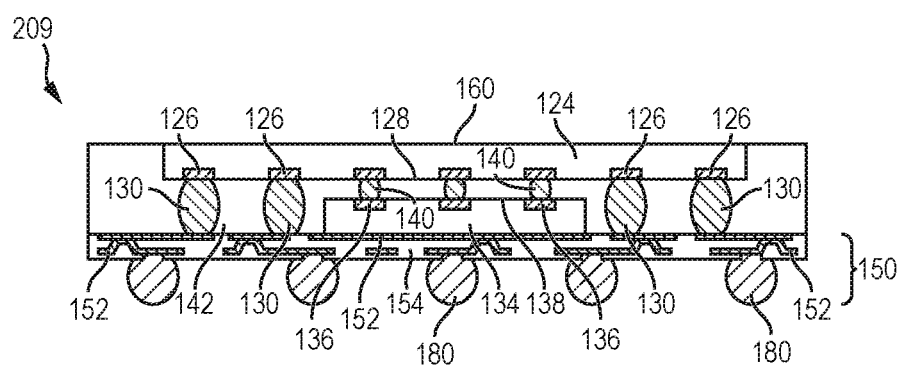
FIG. 7 illustrates a plurality of rows of bumps formed over the top semiconductor die.

FIG. 7 shows an embodiment for 2D WLCSP 209, similar to FIG. 4b, without forming the conductive pillars or vias 148 and without forming interconnect structure 164 over semiconductor die 124, encapsulant 142, and conductive pillars or vias 148. A plurality of rows of bumps 130 is formed between contact pads 126 of semiconductor die 124 and conductive layer 152 of interconnect structure 150. Back surface 160 of semiconductor die 124 is exposed from encapsulant 142.

Figure 8:
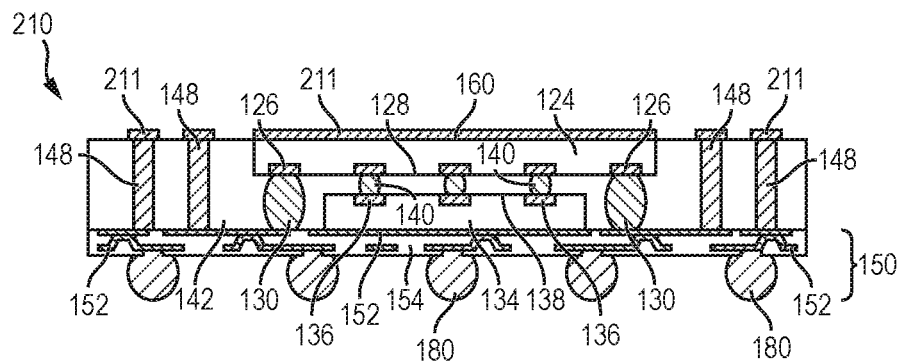
FIG. 8 illustrates a conductive layer formed over the top semiconductor die.

FIG. 8 shows an embodiment for 3D FO-WLCSP 210, similar to FIG. 6, with conductive layer 211 formed over semiconductor die 124, encapsulant 142, and conductive pillars or vias 148. Conductive layer 211 provides electrical interconnect for further package integration.

Figure 9:
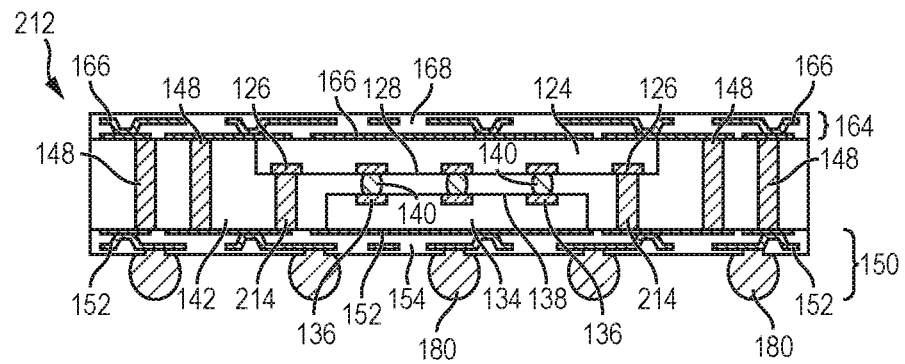
FIG. 9 illustrates conductive pillars formed between the top semiconductor die and bottom-side interconnect structure.

FIG. 9 shows an embodiment for FO-WLCSP 212, similar to FIG. 4b, with conductive vias 214 formed between contact pads 126 of semiconductor die 124 and conductive layer 152 of interconnect structure 150. Conductive vias 214 can be Au, Cu, Ni, or solder.

Figure 10:
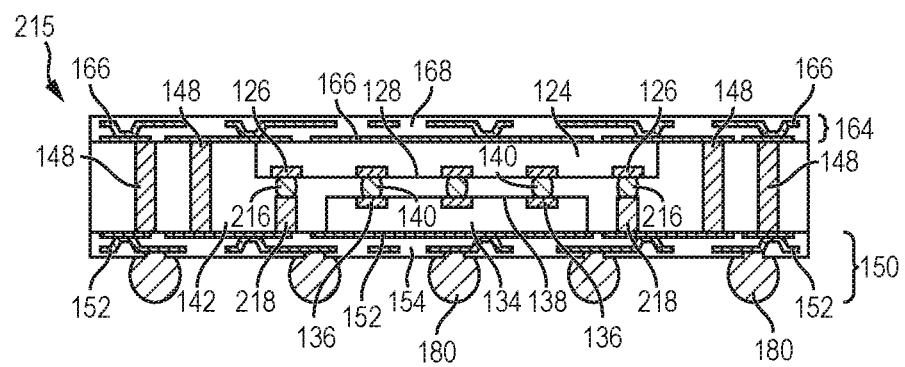
FIG. 10 illustrates bumps stacked over conductive pillars between the top semiconductor die and bottom-side interconnect structure.

FIG. 10 shows an embodiment for FO-WLCSP 215, similar to FIG. 4b, with bumps 216 stacked over conductive vias 218 between contact pads 126 of semiconductor die 124 and conductive layer 152 of interconnect structure 150. Bumps 216 and conductive vias 218 can be Au, Cu, Ni, or solder.

Figure 11:
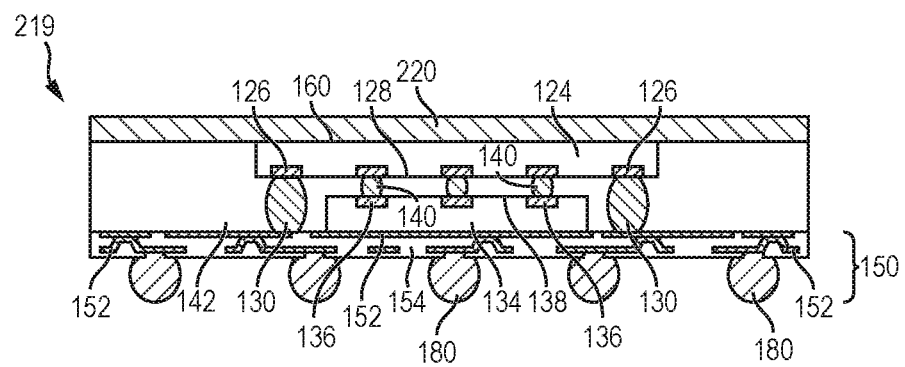
FIG. 11 illustrates a heat sink formed over the top semiconductor die.

FIG. 11 shows an embodiment for 2D WLCSP 219, similar to FIG. 4b, without conductive pillars or vias 148. A heat sink or heat spreader 220 is mounted to semiconductor die 124 and encapsulant 142. Heat sink 220 can be Al, Cu, or another material with high thermal conductivity to provide heat dissipation from semiconductor die 124.

Figure 12:
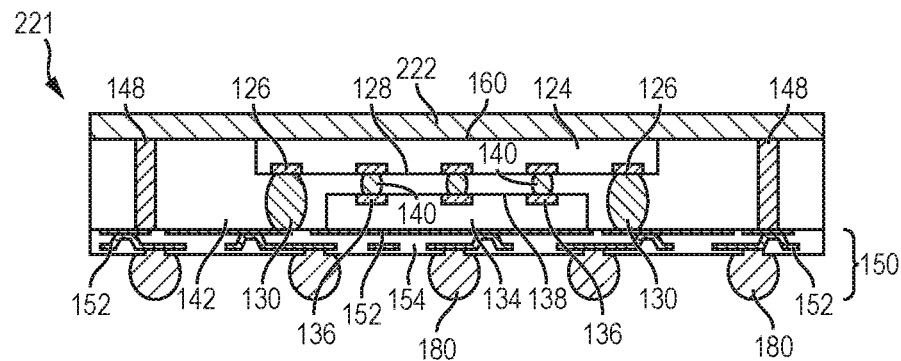
FIG. 12 illustrates a shielding layer formed over the top semiconductor die.

FIG. 12 shows an embodiment for 2D WLCSP 221, similar to FIG. 4b, with a shielding layer 222 mounted to semiconductor die 124, encapsulant 142, and conductive pillars or vias 148. Shielding layer 222 can be Al, ferrite or carbonyl iron, stainless steel, nickel silver, low-carbon steel, silicon-iron steel, foil, conductive resin, and other metals and composites capable of blocking or absorbing electromagnetic interference (EMI), radio frequency interference (RFI), and other inter-device interference. Shielding layer 222 can also be a non-metal material such as carbon-black or aluminum flake to reduce the effects of EMI and RFI. A portion of conductive pillars or vias 148 provide a conduction path from shielding layer 222 through conductive layer 152 and bumps 180 to an external low impedance ground point.

Figure 13:
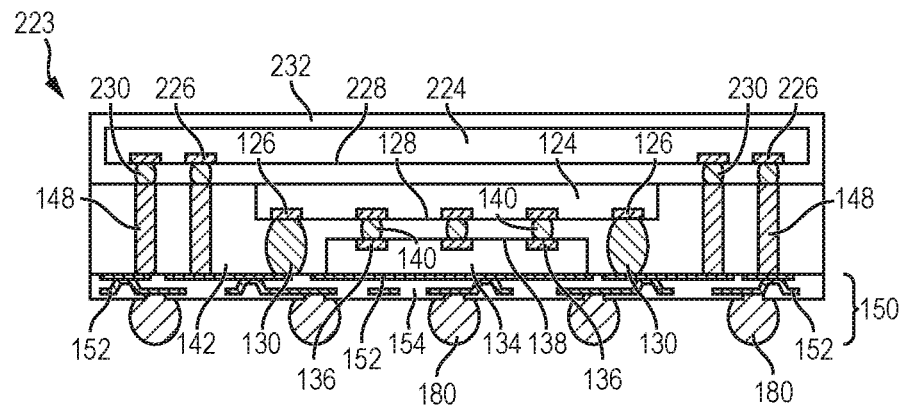
FIG. 13 illustrates a double-molded WLCSP with a semiconductor die mounted to the conductive pillars.

FIG. 13 shows an embodiment for dual-molded WLCSP 223, continuing from FIG. 6, with a semiconductor die or component 224 having contact pads 226 formed over active surface 228 which contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 228 to implement analog circuits or digital circuits, such as DSP, ASIC, memory, or other signal processing circuit. Semiconductor die 224 may also contain IPDs, such as inductors, capacitors, and resistors, for RF signal processing. In one embodiment, semiconductor die 224 is a flipchip type semiconductor die. A plurality of bumps 230 is formed over contact pads 226 of semiconductor die 224 by reflow or thermo-compression bonding, similar to the formation of bumps 130. Semiconductor die 224 is mounted to conductive pillars or vias 148 with bumps 230. A discrete passive or active device, such as inductor, capacitor, resistor, or power transistor, can also be mounted to conductive pillars or vias 148.

An encapsulant or molding compound 232 is deposited over semiconductor die 124 and 224 and encapsulant 142 using a paste printing, compressive molding, transfer molding, liquid encapsulant molding, vacuum lamination, spin coating, or other suitable applicator. Encapsulant 232 can be polymer composite material, such as epoxy resin with filler, epoxy acrylate with filler, or polymer with proper filler. Encapsulant 232 is non-conductive and environmentally protects the semiconductor device from external elements and contaminants. Encapsulants 142 and 232 provide dual-molding for WLCSP 223.

Figure 14:
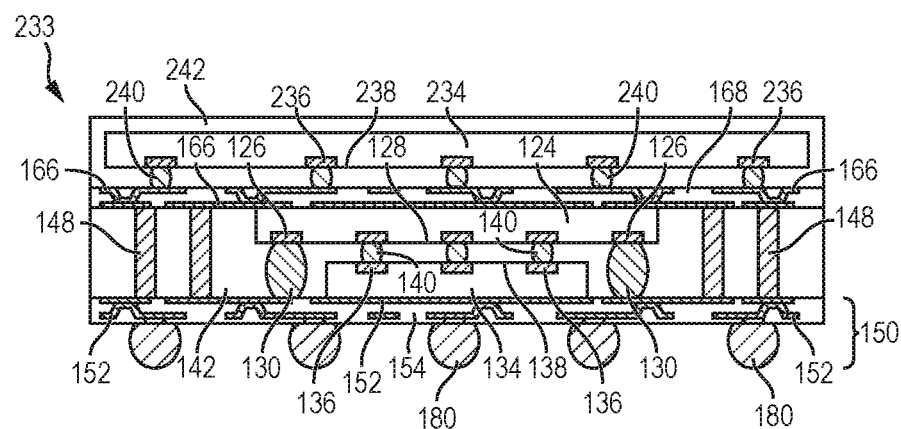
FIG. 14 illustrates a double-molded WLCSP with a semiconductor die mounted to the topside interconnect structure.

FIG. 14 shows an embodiment for dual-molded WLCSP 233, continuing from FIG. 4b, with a semiconductor die or component 234 having contact pads 236 formed over active surface 238 which contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 238 to implement analog circuits or digital circuits, such as DSP, ASIC, memory, or other signal processing circuit. Semiconductor die 234 may also contain IPDs, such as inductors, capacitors, and resistors, for RF signal processing. In one embodiment, semiconductor die 234 is a flipchip type semiconductor die. A plurality of bumps 240 is formed over contact pads 236 of semiconductor die 234 by reflow or thermo-compression bonding, similar to the formation of bumps 130. Semiconductor die 234 is mounted to conductive layer 166 of interconnect structure 164 with bumps 240. A discrete passive or active device, such as inductor, capacitor, resistor, or power transistor, can also be mounted to interconnect structure 164 and electrically connected to conductive layer 166.

An encapsulant or molding compound 242 is deposited over semiconductor die 124 and 234 and encapsulant 142 using a paste printing, compressive molding, transfer molding, liquid encapsulant molding, vacuum lamination, spin coating, or other suitable applicator. Encapsulant 242 can be polymer composite material, such as epoxy resin with filler, epoxy acrylate with filler, or polymer with proper filler. Encapsulant 242 is non-conductive and environmentally protects the semiconductor device from external elements and contaminants. Encapsulants 142 and 242 provide dual-molding for WLCSP 233.

Figure 15:
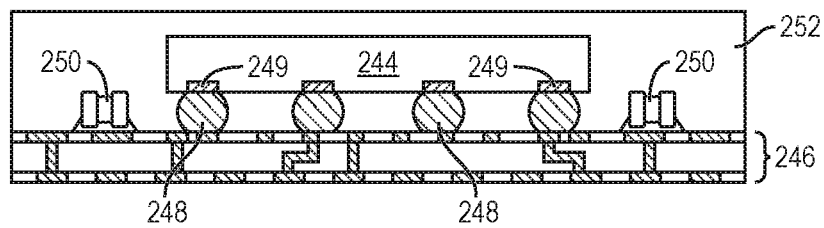
FIG. 15 illustrates a semiconductor die and discrete device mounted to a substrate.

FIG. 15 shows a semiconductor die or component 244 mounted to substrate 246 with bumps 248 formed over contact pads 249. A plurality of discrete passive or active device 250, such as inductor, capacitor, resistor, or power transistor, is also mounted to substrate 246. An encapsulant or molding compound 252 is deposited over semiconductor die 244, discrete devices 250, and substrate 246.

Figure 16:
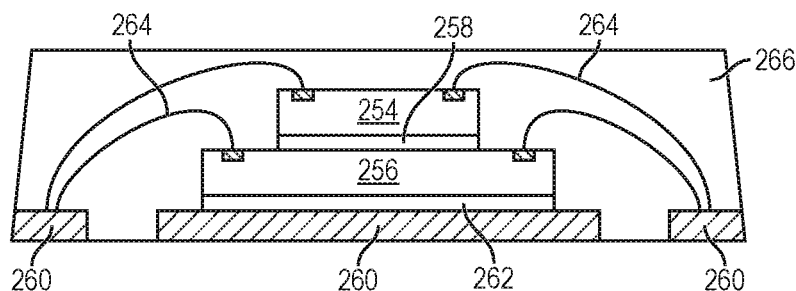
FIG. 16 illustrates a plurality of semiconductor die stacked over a conductive layer and covered by encapsulant.

FIG. 16 shows a semiconductor die or component 254 mounted to semiconductor die or component 256 with adhesive 258. The stacked semiconductor die 254 and 256 are mounted to conductive layer 260 with adhesive 262. A plurality of bond wires 264 are electrically connected between semiconductor die 254 and 256 and conductive layer 260. An encapsulant or molding compound 266 is deposited over semiconductor die 254 and 256, bond wires 264, and conductive layer 260.

Figure 17:
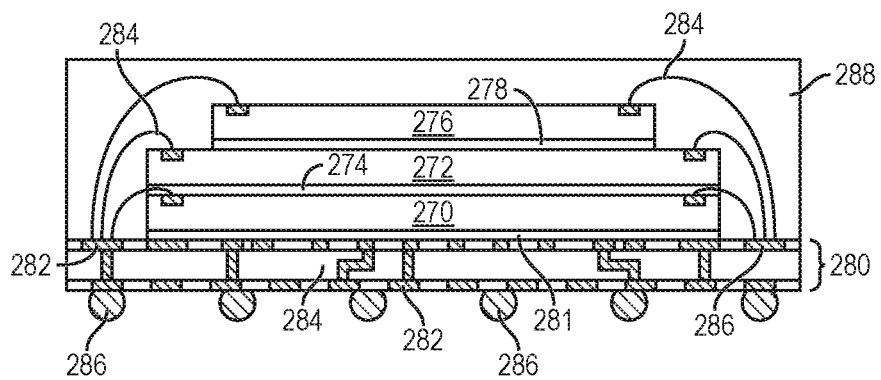
FIG. 17 illustrates a plurality of semiconductor die stacked over a substrate and covered by encapsulant.

FIG. 17 shows a semiconductor die or component 272 mounted to semiconductor die or component 270 with adhesive 274. A semiconductor die or component 276 mounted to semiconductor die or component 272 with adhesive 278. The stacked semiconductor die 270, 272, and 276 are mounted to substrate 280 with adhesive 281. Substrate 280 contains conductive layers 282 separated by insulating layer 284. A plurality of bond wires 284 is electrically connected between semiconductor die 270, 272, and 276 and conductive layer 282. A plurality of bumps 286 is formed over a surface of substrate 280, opposite stacked semiconductor die 270, 272, and 276, and electrically connected to conductive layer 282. An encapsulant or molding compound 288 is deposited over semiconductor die 270, 272, and 276, bond wires 284, and substrate 280.

Any one of the electrical components shown in FIGS. 15-17 can be mounted to any one of the WLCSPs shown in FIGS. 4a-4b and 6-10. In addition, any one of the WLCSPs shown in FIGS. 4a-4b and 6-10 can be mounted to any one of the WLCSPs shown in FIGS. 4a-4b and 6-10.

Figure 18:
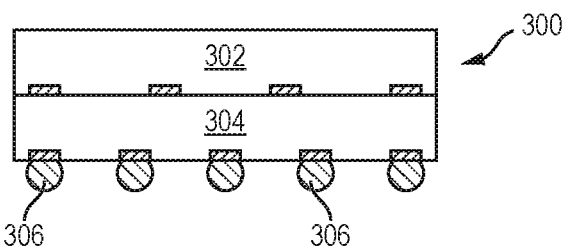
FIG. 18 illustrates a package-on-package semiconductor arrangement.

FIG. 18 shows package-on-package (PoP) arrangement 300 with semiconductor package 302 mounted to semiconductor package 304. Bumps 306 are formed over semiconductor package 304. Any one of the WLCSPs shown in FIGS. 4a-4b and 6-10 can be mounted to a fan-out PoP or fan-in PoP. The combination of any one of the electrical components shown in FIGS. 15-17 mounted to any one of the WLCSPs shown in FIGS. 4a-4b and 6-10 can be mounted to the fan-out PoP or fan-in PoP. The combination of any one of the WLCSPs shown in FIGS. 4a-4b and 6-10 mounted to any one of the WLCSPs shown in FIGS. 4a-4b and 6-10 can be mounted to the fan-out PoP or fan-in PoP.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
providing a first semiconductor die;
disposing a second semiconductor die over the first semiconductor die with an active surface of the second semiconductor die oriented toward an active surface of the first semiconductor die;
forming a first interconnect structure around the first semiconductor die or second semiconductor die;
depositing an encapsulant over the first semiconductor die and second semiconductor die such that the encapsulant is between the first semiconductor die and the second semiconductor die; and
forming a first build-up interconnect structure on a first surface of the encapsulant and on an non-active surface of the first semiconductor die or second semiconductor die, the first build-up interconnect structure having at least one conductive layer and at least one insulating layer adjacent the conductive layer.

2. The method of claim 1, wherein the first interconnect structure includes a plurality of bumps or conductive vias.

3. The method of claim 1, further including removing a portion of the encapsulant to the first interconnect structure.

4. The method of claim 1, further including forming a second build-up interconnect structure over a second surface of the encapsulant opposite the first surface of the encapsulant.

5. The method of claim 1, further including disposing a heat sink on the first semiconductor die or second semiconductor die.

6. The method of claim 1, further including forming a shielding layer over the first semiconductor die or second semiconductor die.

7. The method of claim 1, further including disposing an electrical component over the first build-up interconnect structure.

8. A semiconductor device, comprising:
a first semiconductor die;
a plurality of bumps formed over an active surface of the first semiconductor die;
a second semiconductor die disposed over the first semiconductor die between the bumps with an active surface of the second semiconductor die oriented toward the active surface of the first semiconductor die;
an encapsulant deposited around the first semiconductor die, second semiconductor die, and bumps, and between the first semiconductor die and the second semiconductor die;
a conductive via formed through the encapsulant around the first semiconductor die and second semiconductor die; and
a first build-up interconnect structure formed on a first surface of the encapsulant and on a non-active surface of the first semiconductor die or second semiconductor die, the first build-up interconnect structure having at least one conductive layer and at least one insulating layer adjacent the conductive layer.

9. The semiconductor device of claim 8, wherein the bumps are exposed from the encapsulant.

10. The semiconductor device of claim 8, wherein the conductive via is exposed from the encapsulant.

11. The semiconductor device of claim 8, further including a second build-up interconnect structure formed over a second surface of the encapsulant opposite the first surface of the encapsulant.

12. The semiconductor device of claim 8, further including a heat sink disposed on the first semiconductor die or second semiconductor die.

13. The semiconductor device of claim 8, further including a shielding layer formed over the first semiconductor die or second semiconductor die.

14. A semiconductor device, comprising:
a first semiconductor die;
a second semiconductor die disposed over the first semiconductor die with an active surface of the second semiconductor die oriented toward the active surface of the first semiconductor die;
a first interconnect structure formed around the first semiconductor die or second semiconductor die;
an encapsulant deposited around the first semiconductor die and second semiconductor die and between the first semiconductor die and the second semiconductor die; and
a first build-up interconnect structure formed on a first surface of the encapsulant and on a non-active surface of the first semiconductor die or second semiconductor die, the first build-up interconnect structure having at least one conductive layer and at least one insulating layer adjacent the conductive layer.

15. The semiconductor device of claim 14, wherein the first interconnect structure includes a plurality of bumps.

16. The semiconductor device of claim 14, wherein the first interconnect structure includes a conductive via.

17. The semiconductor device of claim 14, further including a second build-up interconnect structure formed over a second surface of the encapsulant opposite the first surface of the encapsulant.

18. The semiconductor device of claim 14, further including a heat sink disposed on the first semiconductor die or second semiconductor die.

19. The semiconductor device of claim 14, further including an electrical component disposed over the second interconnect structure.

20. A semiconductor device, comprising:
a first semiconductor die;
a second semiconductor die disposed over the first semiconductor die;
an encapsulant deposited around the first semiconductor die and second semiconductor die and between the first semiconductor die and the second semiconductor die;
a conductive via formed through the encapsulant around the first semiconductor die and second semiconductor die; and
a first build-up interconnect structure formed on a first surface of the encapsulant and on a surface of the first semiconductor die or second semiconductor die, the first build-up interconnect structure having at least one conductive layer and at least one insulating layer adjacent the conductive layer.

21. The semiconductor device of claim 20, further including a plurality of bumps over an active surface of the first semiconductor die.

22. The semiconductor device of claim 21, wherein the second semiconductor die is disposed over the first semiconductor die between the bumps with an active surface of the second semiconductor die oriented toward the active surface of the first semiconductor die.

23. The semiconductor device of claim 20, further including a second build-up interconnect structure formed over a second surface of the encapsulant opposite the first surface of the encapsulant.

24. The semiconductor device of claim 20, further including a heat sink disposed on the first semiconductor die or second semiconductor die.

25. The semiconductor device of claim 20, further including a shielding layer formed over the first semiconductor die or second semiconductor die.

* * * * *